United States Patent [19]

Kadakia

[11] Patent Number: 4,823,031
[45] Date of Patent: Apr. 18, 1989

[54] SINGLE-ENDED SENSE AMPLIFIER WITH POSITIVE FEEDBACK

[75] Inventor: Shailesh R. Kadakia, Stafford, Tex.

[73] Assignee: Texas Instruments Incorporated, Dallas, Tex.

[21] Appl. No.: 150,954

[22] Filed: Feb. 1, 1988

[51] Int. Cl.$^4$ .......................... G11C 7/06; G11C 9/00; G11C 17/04; G11C 11/40
[52] U.S. Cl. .................................... 307/530; 307/468; 365/104; 365/196
[58] Field of Search ............... 307/530, 354, 270, 571, 307/581, 584, 482, 468, 362; 365/103, 104, 195, 196, 208

[56] References Cited

U.S. PATENT DOCUMENTS

| | | | |
|---|---|---|---|
| 4,107,556 | 8/1978 | Stewart et al. | 365/196 X |
| 4,535,259 | 8/1985 | Smarandoiu et al. | 307/530 |
| 4,720,816 | 1/1988 | Matsuoka et al. | 365/104 X |
| 4,758,749 | 7/1988 | Rapp | 307/530 |
| 4,763,026 | 8/1988 | Tsen et al. | 307/530 |
| 4,774,692 | 9/1988 | Oishi et al. | 307/530 X |

Primary Examiner—Stanley D. Miller
Assistant Examiner—David R. Bertelson
Attorney, Agent, or Firm—Theodore D. Lindgren

[57] ABSTRACT

A single-ended sense amplifier for use in integrated-circuit logic arrays. The sense amplifier circuit uses five field-effect transistors in a unique configuration that uses positive feedback to increase the output speed of response while at the same time allowing layout in the narrow pitch of one bitline of an integrated-circuit logic array.

12 Claims, 1 Drawing Sheet

SINGLE-ENDED SENSE AMPLIFIER WITH POSITIVE FEEDBACK

BACKGROUND OF THE INVENTION

This invention relates to a sense amplifier for use with integrated-circuit logic arrays.

The increase in density of circuit components necessitated for integrated circuits requires design of individual circuits with very simple fabrication layout. In addition, the movement towards smaller and smaller circuit dimensions has resulted in a need for sensing circuits that operate at faster speeds. Accordingly, there is a requirement for an improved sense amplifier that provides a relatively simple layout, that operates at a speed sufficient to meet the requirements of present technology, and that is reliable.

Prior-art sense amplifiers include differential and single-ended amplifiers with multiple inputs. Such amplifiers ar unsuitable for many applications because they are too slow or because they require complicated reference-generator circuits. Moreover, such amplifiers are difficult to lay out in integrated-circuit form in the narrow pitch of one bitline.

SUMMARY OF THE INVENTION

This invention provides a sense amplifier for a logic arrray circuit using a positive feedback arrangement to improve reliability and speed while at the same time allowing layout in the narrow pitch of one bitline of an integrated-circuit logic array. The amplifier defaults to a logic high level output when operating at standby, requiring no power for operation while in that condition. The sense amplifier is constructed using five field-effect transistors in a unique configuration that uses positive feedback to increase the speed of change of voltage at the output of the amplifier.

BRIEF DESCRIPTION OF THE DRAWINGS

The novel features of the invention are set forth in the appended claims. The invention, its features, and its advantages are described below in conjunction with the following drawing:

DETAILED DESCRIPTION OF THE EMBODIMENT

Figure 1:
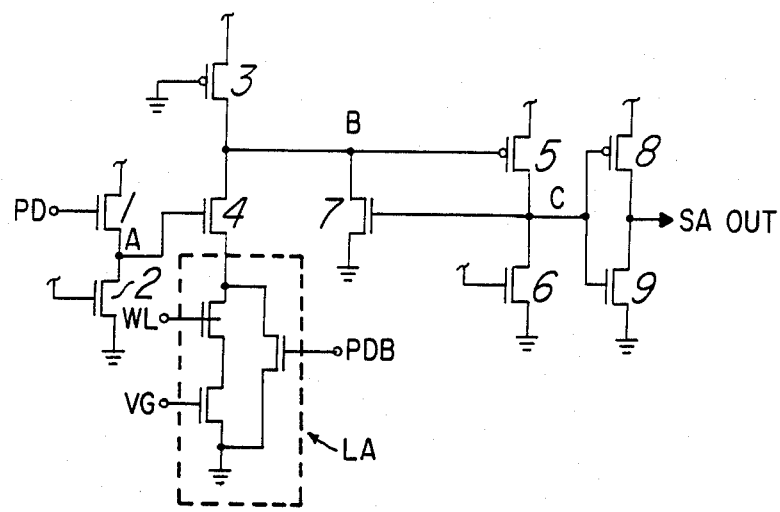
FIG. 1 is a circuit diagram of the sense amplifier of this invention shown in conjunction with a bitline and a wordline of an integrated circuit memory device.

Referring to FIG. 1, activating transistors 1 and 2 are of the same type and have sources and drains connected in series between the supply voltage and ground or other reference voltage. The gate of N-type transistor 1, which is nearest the supply voltage, is connected to a direct-current voltage activating signal PD which is at relatively high voltage when the integrated circuit is activated and at relatively low voltage when the integrated circuit is deactivated. The gate of N-type transistor 2, which is nearest ground or other reference voltage, is connected to the supply voltage. The output node A of activating transistor pair 1,2 is taken from the common terminal between the series-connected transistor pair 1,2.

Sensing transistors 3 and 4 are of complementary P- and N-channel types and have sources and drains connected in series between the supply voltage and a bitline BL of an integrated circuit logic array LA. Logic array LA includes a wordline WL and may have a virtual ground capability VG and a power-down capability PDB, which is the complement of the PD signal, for shutdown of power to the array. The gate of P-channel transistor 3, which is nearest the supply voltage, is connected to ground or other source of reference voltage. The gate of N-channel transistor 4, which is nearest the bitline, is connected to the output node A of activating transistor pair 1,2. The output node B of sensing transistor pair 3,4 is taken from the common terminal between the series-connected transistor pair 3,4.

Output driver transistors 5 and 6 are of complementary P- and N-channel types and have sources and drains connected in series between the supply voltage and ground or other reference voltage. The gate of P-type transistor 5, which is nearest the supply voltage, is connected to the output node B of sensing transistor pair 3, 4. The gate of N-type transistor 6, which is nearest ground or other reference voltage, is connected to the supply voltage. The output node C of output driver transistor pair 5,6 is taken from the common connection between the two transistors 5 and 6.

N-type feedback transistor 7 has a source-drain connection between the output node B of sensing transistor pair 3,4 and ground or other reference voltage. The gate of transistor 7 is connected to the output node C of output driver transistor pair 5,6.

The output of activating transistor pair 1,2 may be used to provide power to perhaps as many as eight sense amplifiers of the type embodied by transistors 3–7 without significant adverse effect on the voltage at node A caused by the coupling back of switching noise.

During operation of the circuit, a relatively low input voltage PD at the input to sensing transistor pair 1,2 causes the voltage output of that pair at node A to be at ground or other reference potential. This causes sensing transistor pair 3,4 to drive its output node B to a relatively high value of voltage and, in turn, causes output driver transistor pair 5,6 to drive its output node C to a relatively low value of voltage. Inverter transistor pair 8,9 transforms the low output voltage at node C to a relatively high voltage output at node SAOUT, the high voltage corresponding to a logic "1". With a relatively low voltage PD at the input to activating transistor pair 1,2, the output SAOUT will be a logic "1" regardless of the input state of bitline BL.

At relatively large input voltage PD, node B will be at relatively high voltage level if bitline BL is also at a relatively high voltage level and will be at a relatively low voltage level if bitline BL is also at a relatively low voltage level. The relative voltage at node B is inverted by each of transistor pairs 5,6 and 8,9 to result in a signal at the SAOUT output node corresponding to the relative level of voltage at bitline BL.

The positive feedback provided by transistor 7 causes node C to switch from one voltage level to another voltage level at a higher speed than would be the case without the presence of transistor 7 in the circuit. For example, as the voltage at node B decreases to below the threshold voltage of P-channel transistor 5, transistor 5 will become conductive and will force the voltage at node C toward the value of the supply voltage. At the time that node C rises above the threshold voltage of N-channel transistor 7, transistor 7 will conduct and the voltage at node B will be caused to decrease more rapidly. This causes transistor 5 to become even more conductive in a shorter time period, thereby increasing the switching speed of the circuit.

While the invention has been described with reference to an illustrative embodiment, the description is not to be construed in a limiting sense. Various modifications of the illustrative embodiment of the invention will be apparent to those of skill in the art and it is contemplated that the appended claims will cover any such modifications that fall within the scope of the invention.

What is claimed is:

1. A sense amplifier for indicating the state of a bitline of an integrated-circuit logic array comprising:
   a supply voltage source,
   an activating transistor pair connected to an activating signal source,
   a sensing transistor pair connected to said activating transistor pair and to said bitline,
   an output driver transistor pair connected to said sensing transistor pair,
   a feedback transistor connecting the output of said output driver transistor pair to the input of said output driver transistor pair, and
   an inverter transistor pair connecting said output driver transistor pair to an output terminal of said sense amplifier.

2. The sense amplifier of claim 1 in which the source/drain paths of said activating transistor pair are connected in series between said voltage source and a reference potential, in which the gate of the transistor of said activating pair nearest said voltage source is connected to said activating signal source, and in which the gate of the other transistor of said activating pair is connected to said voltage source.

3. The sense amplifier of claim 2 in which said activating transistor pair is comprised of N-channel field-effect transistors.

4. The sense amplifier of claim 2 in which the source/drain paths of said sensing transistor pair are connected in series between said voltage source and said bitline, in which the gate of the transistor of said sensing pair nearest said voltage source is connected to a reference potential, and in which the gate of the other transistor of said sensing pair is connected to the common terminal of said series-connected activating transistor pair.

5. The sense amplifier of claim 4 in which said sensing transistor pair is comprised of a P-channel transistor nearest said voltage source and of a N-channel transistor nearest said bitline.

6. The sense amplifier of claim 4 in which the source/drain paths of said output driver transistor pair are connected in series between said voltage source and a reference potential, in which the gate of the transistor of said output pair nearest said voltage source is connected to the common terminal of said series-connected sensing amplifier pair, and in which the gate of the other transistor of said output pair is connected to said voltage source.

7. The sense amplifier of claim 6 in which said output driver transistor pair is comprised of a P-channel transistor nearest said voltage source and of a N-channel transistor nearest said reference potential.

8. The sense amplifier of claim 6 in which the source/drain path of said feedback transistor is connected between the gate of the transistor of said output pair nearest said voltage source and reference potential and in which the gate of said feedback transistor is connected to the common terminal of said output driver transistor pair.

9. The sense amplifier of claim 8 in which said feedback transistor is a N-channel transistor.

10. The sense amplifier of claim 8 in which the source/drain paths of said inverter transistor pair ar connected in series between said voltage source and reference potential, in which the gates of each of said inverter pair are connected to the common terminal of said output driver transistor pair, and in which the common terminal of said inverter pair is connected to said output terminal of said sense amplifier.

11. The sense amplifier of claim 10 in which the transistor of said inverter pair nearest said voltage source is a P-channel transistor and in which the other transistor of said inverter pair is a N-channel transistor.

12. An amplifier for sensing the state of an integrated-circuit logic-array bitline comprising:
   a series sensing transistor pair of opposite channel type connected at one end to said bitline and at the other end to a voltage source and with gate of the P-channel transistor of said sensing pair nearest said source connected to reference potential and with gate of the N-channel transistor of said sensing pair connected to an activating transistor pair,
   a series output driver transistor pair of opposite channel type connected at one end to said voltage source and at the other end to said reference potential and with gate of the P-channel transistor of said driver pair nearest said source connected to the common terminal of said sensing transistor pair and with gate of the N-channel transistor of said driver pair connected to said voltage source, and
   an N-channel feedback transistor connected between the common terminal of said sensing pair and said reference potential and with a gate connected to the common terminal of said driver pair,
   wherein the electrical signal at the common terminal of said driver pair is inverted by an inverter transistor pair to form the output of said amplifier.

* * * * *